United States Patent [19]
Roychowdhury

[11] Patent Number: 5,995,733
[45] Date of Patent: Nov. 30, 1999

[54] METHOD AND APPARATUS FOR EFFICIENT DESIGN AND ANALYSIS OF INTEGRATED CIRCUITS USING MULTIPLE TIME SCALES

[75] Inventor: Jaijeet Roychowdhury, Murray Hill, N.J.

[73] Assignee: Lucent Technologies, Inc., Murray Hill, N.J.

[21] Appl. No.: 08/789,353

[22] Filed: Jan. 27, 1997

[51] Int. Cl.$^6$ .................................................. G06F 15/20
[52] U.S. Cl. ................... 395/500.07; 395/500.03
[58] Field of Search .......................... 364/488, 148.07; 706/22

[56] References Cited

U.S. PATENT DOCUMENTS

| | | | |
|---|---|---|---|
| 5,057,992 | 10/1991 | Traiger | 364/148 |
| 5,394,346 | 2/1995 | Milsom | 364/578 |
| 5,442,569 | 8/1995 | Osano | 364/578 |
| 5,677,846 | 10/1997 | Kumashiro | 364/488 |
| 5,706,402 | 1/1998 | Bell | 395/23 |

OTHER PUBLICATIONS

K.S. Kundert, etal, Steady–State Methods for Simulating Analog and Microwave Circuits; 1990.
T.J. Aprille, etal, Steady–State Analysis of Nonlinear Circuits with Periodic Imputs, Jan., 1972; 60(1):108–114.
S. Skelboe, Computation of the Periodic Steady–State Response of Nonlinear Networks by Extrapolation Methods Mar., 1980; 27(3):161–175.
R. Telichevesky, etal, Efficient Steady–State Analysis Based on Matrix–Free Krylov Subspace Methods, 1995, pp. 480–484.
R.C. Melville, etal, Efficient Multi–tone Distortion Analysis of Analog Integrated Circuits, 1995.
K.S. Kundert, etal, A Mixed Frequency–Time Approach for Distortion Analysis of Switching Filter Circuits, 1989, 24(2):443–451.
Freund, R.W., etal, Iterative Solution of Linear Systems, in Acta Numerica, 1992, pp. 57–100.
Brachtendorf, H.G., etal, Numerical Steady–State Analysis of Electronic Circuits Driven by Multi–tone Signals, in Electrical Engineering, 1996, pp. 103–112.
Rosch, M.H.F.,etal., Schnelle Stationare Simulation Nichtlinearer Schaltungen im Frequenzbereich, 1992, pp. 168–176 (no translation available).

*Primary Examiner*—Kevin J. Teska
*Assistant Examiner*—Thuan Do

[57] ABSTRACT

Novel algorithms for computing the responses of circuits to multi-tone excitations. The new algorithms are efficient and robust for large, strongly nonlinear circuits excited by multi-tone (quasi-periodic or envelope-modulated) signals. Hence they are particularly useful for integrated RF applications. The multivariate representation captures features produced by strong nonlinearities (such as spikes or pulses) much more compactly than traditional frequency- or time-domain representations. The new algorithms compute these functions efficiently by solving a partial differential equation ODE) in the time or mixed frequency-time domains. Frequency-domain spectra or time-domain waveforms are generated from the multivariate functions as cheap post-processing steps. Two methods, multivariate FDTD and hierarchical shooting, are purely time-domain techniques suitable for the general strongly nonlinear circuit problem. They differ in their memory and computation needs. A new mixed frequency-time method is more efficient for circuits that are moderately (but not strongly) nonlinear in one or more tones (e.g., switching mixers, switched-capacitor filters). The linear systems at the core of all three techniques are especially well suited for iterative solution. This is exploited in the methods to achieve linear growth of computation and memory with respect to circuit size. The mixed frequency-time method of this work avoids the ill-conditioning problem by computing with the slow harmonic components directly, rather than with time-domain samples at sets of points close to each other.

13 Claims, 9 Drawing Sheets

METHOD AND APPARATUS FOR EFFICIENT DESIGN AND ANALYSIS OF INTEGRATED CIRCUITS USING MULTIPLE TIME SCALES

FIELD OF THE INVENTION

The invention pertains to the field of design of integrated circuits. More particularly, the invention pertains to the use of time-domain and mixed frequency-time methods of analysis for strongly nonlinear circuits with multi-tone excitations to produce an efficient integrated circuit (IC).

BACKGROUND OF THE INVENTION

Many circuits of practical importance operate in strongly nonlinear regimes under multi-tone (i.e., with several independent time-scales or frequencies) excitations. Familiar examples are switched-capacitor circuits and switching power converters; more recently, RF designs for portable communications have started incorporating new topologies from baseband IC circuits, which often have strongly nonlinear sections.

In typical RF applications, the multi-tone inputs are quasi-periodic (see K. S. Kundert, J. K. White, and A. Sangiovanni-Vincentelli, *Steady-State Methods For Simulating Analog And Microwave Circuits*, Kluwer Academic Publishers, 1990) or envelope-modulated (see D. Sharrit. "New Method of Analysis of Communication Systems", *MTTS96 WMFA: Nonlinear CAD Workshop*, June 1996), with timescales of different tones separated by orders of magnitude.

Two classes of methods exist for computing a periodic or quasi-periodic steady state solution of a circuit: shooting/FDTD and harmonic balance.

Shooting and FDTD, both time-domain methods, are closely related. Shooting (see T. J. Aprille and T. N. Trick, "Steady-state analysis of nonlinear circuits with periodic inputs," *Proc. IEEE*, 60(1):108–114, January 1972; and S. Skelboe, Computation of the periodic steady-state response of nonlinear networks by extrapolation methods. IEEE Trans. Ckts. Syst., CAS-27(3):161–175, March 1980) is based on finding an initial state for a circuit's differential equations such that the circuit returns to the same state after one period of the input. From a guess for the initial state, the circuit's final state after one period is determined by a standard transient analysis. If the final state is not equal to the initial one, the guess is refined using a newton or relaxation algorithm around the circuit's state transition function. FDTD methods solve for the circuit's values over an input period simultaneously rather than sequentially as in shooting. Recently, iterative linear algebra techniques have been applied (see R. Telichevesky, K. Kundert, and J. White, "Efficient Steady-State Analysis based on Matrix-Free Krylov Subspace Methods," *Proc. IEEE DAC*, pages 480–484, 1995) to these methods, making them efficient for large circuits.

These time-domain methods can analyze strongly nonlinear circuits easily. A significant weakness, however, has been their inability to handle widely-separated multi-tone problems efficiently. The usual approach has been to treat a multi-tone problem as a single-tone one of period equal to that of the slowest tone. This leads to simulations of thousands or millions of periods of the fast tones, which can be very inefficient.

Harmonic balance (HB) methods address the problem in the frequency domain (see R. J. Gilmore and M. B. Steer, "Nonlinear Circuit Analysis using the Method of Harmonic Balance—a review of the art. Part 1. Introductory Concepts," *Int. J on Microwave and Millimeter Wave CAE*, 1(1), 1991). All waveforms in the circuit are expressed in truncated multi-tone Fourier series; the circuit's differential equations are recast as a set of algebraic equations in the series coefficients. These equations are solved numerically with a Newton-Raphson or relaxation scheme. Traditional algorithms for HB were limited to analyzing relatively small circuits; this problem was recently overcome by exploiting factored-matrix forms for the HB jacobian matrix and using interative linear solvers (see R. C. Melville, P. Feldmann, and J. Roychowdhury, "Efficient Multi-tone Distortion Analysis of Analog Integrated Circuits," *Proc. IEEE CICC*, May 1995).

Harmonic balance is the method of choice for multi-tone analysis if a circuit has the following features: (1) all waveforms can be represented accurately by Fourier series with relatively few terms; and (2) nonlinearities are mild to moderate. Since traditional microwave and RF circuits have these properties, 1B has been used extensively for these applications. However, recent RF designs for portable communications incorporate new topologies imported from baseband IC circuits, which often have sections that are strongly nonlinear. Strongly nonlinear circuits generate waveforms that are not well-represented by short Fourier series, hence harmonic balance is inefficient for such applications. However, if the inputs themselves are sharp waveforms that do not admit of a compact representation in a Fourier basis, HB can be ineffective even for mildly nonlinear circuits switched-capacitor filters, switching mixers).

Another weakness relates to the structure of the HB jacobian matrix, which is block-diagonally dominant if the nonlinearities are weak, but ceases to be so if the nonlinearities are strong. Recent HB algorithms for large circuits rely on preconditioners for solving the jacobian iteratively; existing preconditioners often become ineffective as diagonal dominance is lost, resulting in failure of the method. The time-domain methods presented in this work alleviate both the efficient representation problem (by not relying on Fourier series expansions) and the dominance problem (the time-domain jacobian is diagonally dominant for most practical circuits).

Kundert et al (K. Kundert, J. White, and A. Sangiovanni-Vincentelli, "A Mixed Frequency-Time Approach for Distortion Analysis of Switching Filter Circuits," *IEEE J. Solid-State Ckts.*, 24(2):443–451, April 1989) proposed a mixed frequency-time approach to simulate an important special case of the multi-tone problem, characterized by strong nonlinearity in only one tone and mild nonlinearity in the others. By representing signals in mildly nonlinear paths with Fourier series of few terms, they obtain a relation between two sets of time-domain samples, separated by the period of the strongly nonlinear tone. Another relation between these sets is obtained from the circuit's differential equations. Equating these two relations enables the mildly nonlinear tones of the quasi-periodic solution to be computed efficiently. Typically, the strongly nonlinear tone (e.g., clock) is much faster than the weakly nonlinear ones; this can lead to numerical ill-conditioning of this algorithm, because slowly-varying signals are extrapolated from their variation over one period of the fast tone.

SUMMARY OF THE INVENTION

Novel algorithms are presented for computing the responses of circuits to multi-tone excitations. The new algorithms are efficient and robust for large, strongly nonlinear circuits excited by multi-tone (quasi-periodic or envelope-modulated) signals. Hence they are particularly useful for integrated RF applications.

The multivariate representation captures features produced by strong nonlinearities (such as spikes or pulses) much more compactly than traditional frequency- or time-domain representations. The new algorithms compute these functions efficiently by solving a partial differential equation (PDE) in the time or mixed frequency-time domains. Frequency-domain spectra or time-domain waveforms are generated from the multivariate functions as cheap post-processing steps.

Two methods, multivariate FDTD and hierarchical shooting, are purely time-domain techniques suitable for the general strongly nonlinear circuit problem. They differ in their memory and computation needs. A new mixed frequency-time method is more efficient for circuits that are moderately (but not strongly) nonlinear in one or more tones (e.g., switching mixers, switched-capacitor filters).

The linear systems at the core of all three techniques are especially well suited for iterative solution. This is exploited in the methods to achieve linear growth of computation and memory with respect to circuit size.

The mixed frequency-time method of this work avoids the ill-conditioning problem by computing with the slow harmonic components directly, rather than with time-domain samples at sets of points close to each other.

Efficient and robust simulation methods are presented for circuits with this combination of properties. The key idea is that a multi-tone waveform can be represented much more efficiently as a multivariate function (i.e., a function of several "time" variables) than as a function of a single time variable. The concept is illustrated in Section A, below, with a simple example. Using the multivariate functions changes the circuit's differential algebraic equations (DAEs) into partial differential equations (PDEs, see Section B, below). The novel methods presented in Section C, below, solve these PDEs in such a way that the efficiency of the multivariate representation is exploited.

Strong nonlinearities are handled by sampling the multivariate functions adaptively at non-uniformly spaced points, so that spikes and pulses are represented accurately and efficiently.

DETAILED DESCRIPTION OF THE INVENTION

In the present invention, the MCPDE is not used purely for harmonic balance; instead, new methods are developed to solve it efficiently in the time domain and thus handle strong nonlinearities. Localized (piecewise polynomial) basis functions are used to solve the MCPDE, leading to hierarchical shooting and multivariate FDTD; combining localized and Fourier bases leads to the new mixed frequency-time method.

The methods of the invention are formulated in the time and mixed frequency-time domains. Two purely time-domain methods, hierarchical shooting and multivariate FDTD, are presented for the strongly nonlinear multi-tone problem. Hierarchical shooting requires less memory than multivariate FDTD; however, the latter is more efficient for high-Q circuits. A mixed frequency-time method that combines harmonic balance with the time-domain methods is also presented; it is more efficient than the time-domain methods for circuits that are mildly nonlinear in some tones but strongly nonlinear in others (e.g., switching mixers, switched capacitor filters). Iterative linear algebra techniques are especially suited to the methods of the invention on account of diagonally-dominant Jacobian matrix structure. Their use results in linear computation and memory growth with circuit size.

Results from the new techniques are presented in Section D. Improvements in accuracy, and speedups of over two orders of magnitude over existing techniques, are obtained with the new methods.

A. An Illustrative Example: Multivariate Representations of Multi-Tone Signals

Figure 1:
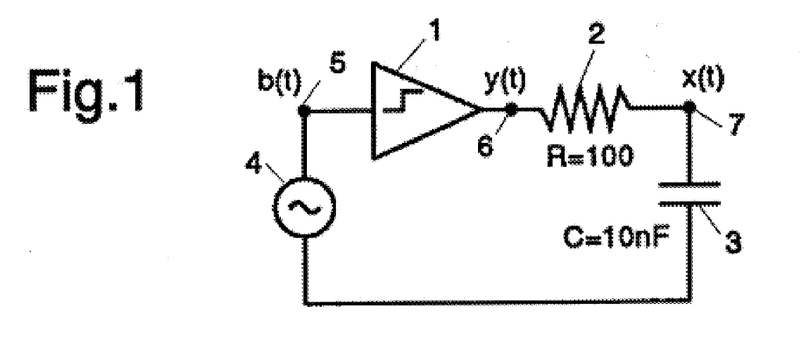
FIG. 1 shows a schematic of a comparator followed by an RC filter, analyzed in section A, below.
Figure 2:
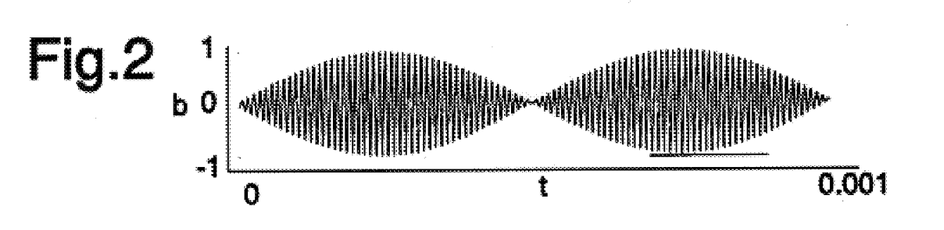
FIG. 2 shows a graph of a two-tone quasi-periodic waveform input to the comparator, used in the analysis of the circuit of FIG. 1.

The circuit of FIG. 1 consists of a comparator (1) followed by a resistor (2)/capacitor (3) ("RC") filter. Waveform b(t), the input (5) to the comparator (1), from an AC generator (4) is a simple two-tone quasi-periodic signal (shown in FIG. 2) given by:

$$b(t) = \sin\left(\frac{2\pi}{T_1}t\right)\sin\left(\frac{2\pi}{T_2}t\right), T_1 = 1 \text{ ms}, T_2 = 0.01 \text{ ms}$$

The two tones are at frequencies $$f_1 = \frac{1}{T_1} = 1 \text{ kHz and } f_2 = \frac{1}{T_2} = 100 \text{ kHz}.$$

As can be seen, there are 100 fast-varying sinusoids of period $T_2=0.01$ ms modulated by a slowly-varying sinusoid of period $T_1=1$ ms.

In a traditional transient or shooting analysis of the circuit, the time-steps need to be spaced closely enough that each fast sinusoid in b(t) is represented accurately. If each sinusoid is sampled at n points, the total number of time-steps needed for one period of the slow modulation is $$n\frac{T_1}{T_2}.$$

To generate FIG. 2, 15 points were used per sinusoid, hence the total number of samples was 1500.

Now consider a bi-viriate representation for b(t) obtained as follows: for the slowly-varying parts of the expression for b(t), t is replaced by $t_1$; for the fast-varying parts, by $t_2$. The resulting function of two variables is denoted by $\hat{b}(t_1, t_2)$:

$$\hat{b}(t_1, t_2) = \sin\left(\frac{2\pi}{T_1}t_1\right)\sin\left(\frac{2\pi}{T_2}t_2\right), T_1 = 1 \text{ ms}, T_2 = 0.01 \text{ ms} \quad (2)$$

Figure 3:
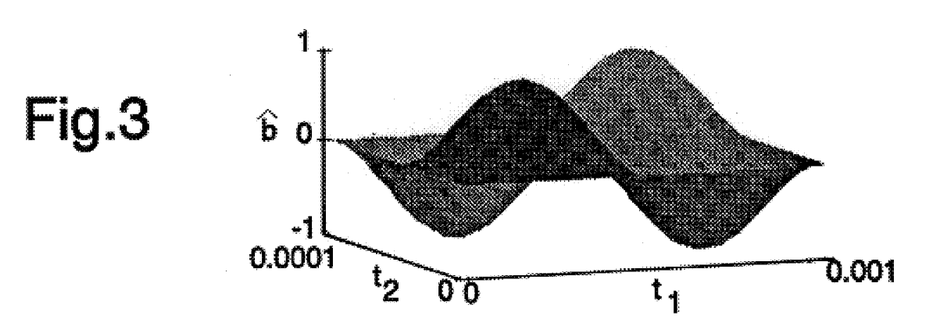
FIG. 3 shows the graph of a corresponding two-periodic bivariate function for the circuit of FIG. 1.

Note that it is easy to recover b(t) from $\hat{b}(t_1, t_2)$, simply by setting $t_1=t_2=t$. Note also that $\hat{b}(t_1, t_2)$, is bi-periodic (periodic with respect to both $t_1$ and $t_2$, $\hat{b}(t_1+T_1, t_2+T_2)=\hat{b}(t_1, t_2)$). The plot of $\hat{b}(t_1, t_2)$ on the rectangle $0 \leq t_1 \leq T_1$, $0 \leq t_2 \leq T_2$ is shown in FIG. 3. Because $\hat{b}$ is bi-periodic, this plot repeats over the rest of the $t_1$–$t_2$ plane.

Note further that $\hat{b}(t_1, t_2)$ can be represented by relatively few points, unlike FIG. 2. FIG. 3 was plotted with 225 samples on a uniform 15×15 grid—an order of magnitude fewer than for FIG. 2.

Moreover it is easy to generate the original quasi-periodic signal b(t) from $\hat{b}(t_1, t_2)$, using the relation $b(t)=\hat{b}(t, t)$. Because $\hat{b}$ is bi-periodic, each point in the plot of b(t) (FIG. 2) maps onto a corresponding point on the plot of $\hat{b}(t_1, t_2)$ (FIG. 3). For example:

b(1.952 ms)=$\hat{b}$(1.952 ms, 1.952 ms)=$\hat{b}(T_1+0.952$ ms, 195 $T_2+0.002$ ms)=$\hat{b}$(0.952 ms, 0.002 ms)

The above illustrates two important features:

1. the bi-variate form requires far fewer points to represent numerically than the original quasi-periodic signal, yet
2. it contains all the information needed to recover the original signal completely.

This is true not only for quasi-periodic signals with a compact frequency domain representation domain (such as b(t) in Equation 1, with only two frequency components, $f_1 \pm f_2$), but also for those that cannot be represented efficiently in the frequency domain. For example, consider the quasi-periodic digital signal y(t) at the output (6) of the comparator:

y(t)=comp(b(t)), comp(z)=1 if z>0, 0 otherwise

Figure 4:
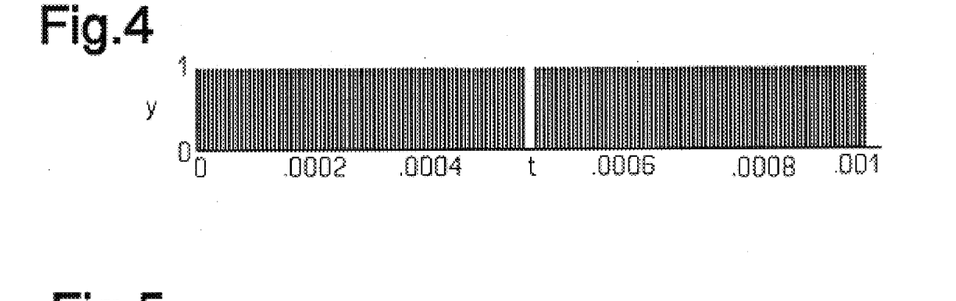
FIG. 4 shows a graph of the output of the comparator of FIG. 1, when fed by the waveform of FIG. 2.
Figure 5:
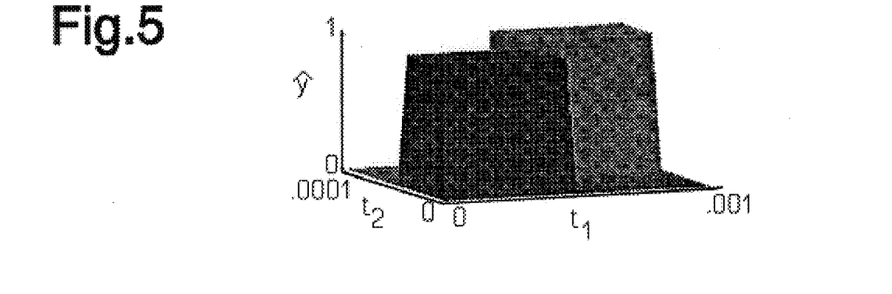
FIG. 5 shows a bi-variate representation of the waveform of FIG. 4.

Representing y(t) in the frequency domain requires more than 625 Fourier coefficients, since at least 25 harmonics in each tone are needed to represent a square wave accurately. As for the univariate time-domain representation, more than 400 points are needed, as shown in FIG. 4. However, the bi-variate representation $\hat{y}(t_1, t_2)$, given by $\hat{y}(t_1, t_2)$=comp($\hat{b}(t_1, t_2)$), plotted in FIG. 5, requires only about 40 points to represent accurately. y(t) is easily recoverable by the relation y(t)=$\hat{y}$(t, t) and the bi-periodicity of $\hat{y}$.

The key to the techniques of the invention is to solve for the multivariate forms of all the node voltages and branch currents of a circuit directly, using the new numerical methods in the time and mixed frequency-time domains.

Figure 6:
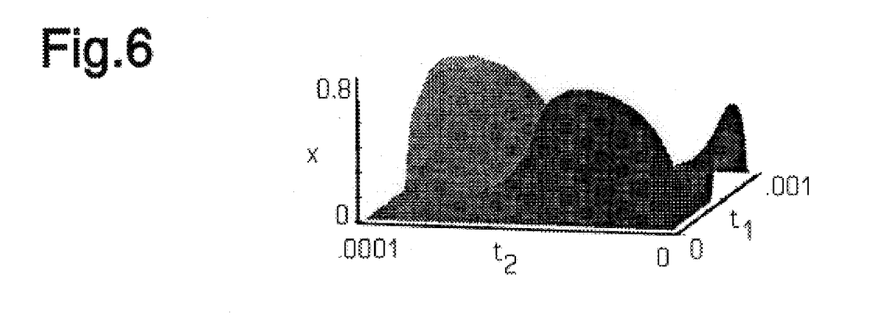
FIG. 6 shows a graph of a bivariate solution for the circuit of FIG. 1, using the methods of the invention.
Figure 7:
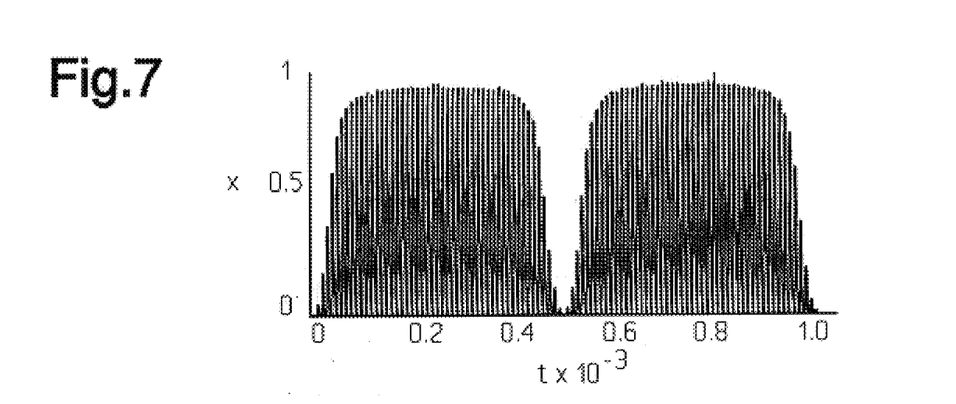
FIG. 7 shows a graph of a univariate solution corresponding to the solution of FIG. 6.

In order to do this, the circuit equations are rewritten in terms of the multivariate functions. Given the differential equation for the circuit of FIG. 1:

$$\dot{x} = \frac{\text{comp}(b(t)) - x}{RC} \quad (3)$$

it can be shown (see Section B, below) that the multivariate forms satisfy the following partial differential equation (PDE):

$$\frac{\partial \hat{x}}{\partial t_1} + \frac{\partial \hat{x}}{\partial t_2} = \frac{\text{comp}(\hat{b}(t_1, t_2)) - \hat{x}(t_1, t_2)}{RC} \quad (4)$$

with the boundary condition that $\hat{x}(t_1, t_2)$ is bi-periodic, i.e., $\hat{x}(t_1=T_1, t_2+T_2)=\hat{x}(t_1, t_2)$. The solution $\hat{x}(t_1, t_2)$, obtained using the methods of the invention described in Section C, below, is plotted in FIG. 6. The univariate solution x(t), generated using x(t)=$\hat{x}$(t, t), is plotted in FIG. 7. Again it is apparent that for a given accuracy, the bi-variate form can be sampled much more compactly than the univariate form.

B. Multi-rate Circuit Partial Differential Equation (MCPDE) Formulation

In this section, presented for better understanding of the later-described methods of the invention, it is shown that the multi-tone circuit problem can be posed as a partial differential equation (PDE), leading to efficient algorithms for the strongly nonlinear multi-tone problem. Based on the differential-algebraic equations (DAEs) describing a circuit (Equation 5), an Multi-rate Circuit Partial Differential Equation (MCPDE) is proposed in Equation 6.

Three theorems about the MCPDE are then presented to set the stage for the numerical methods of Section C, below. Theorems 1 and 2 establish that any solution of the MCPDE with periodic boundary conditions corresponds to a quasi-periodic solution of the circuit DAEs. Theorem 3 shows that a unique periodic solution of the MCPDE exists for the standard linear ODE test problem. Together, the theorems justify that the MCPDE formulation is relevant and well-defined. The numerical methods of the invention use the MCPDE to exploit the efficiency of the multivariate representation.

The circuit's equations can be written in DAE form as:

$$\dot{q}(x) = f(x) + b(t) \quad (5)$$

All variables except t (time) are vector-valued. x are the unknowns in the circuit (node voltages and branch currents); q the charge terms and f the resistive terms; b(t) is the vector of excitations to the circuit (typically consisting of independent voltage/current sources).

To solve Equation 5 when the excitation b(t) has m tones, an Multi-rate Circuit Partial Differential Equation is defined to be:

$$\frac{\partial q(\hat{x})}{\partial t_1} + \cdots + \frac{\partial q(\hat{x})}{\partial t_m} = f(\hat{x}) + \hat{b}(t_1, \cdots, t_m) \quad (6)$$

While f and q are the same functions as in Equation 5, $\hat{x}(t_1, \ldots, t_m)$ and $\hat{b}(t_1, \ldots, t_m)$ are new multivariate functions of m variables $t_1, \ldots, t_m$. The m-variate signals $\hat{x}$, b and the m independent variables $t_1, \ldots, t_m$ need not be assumed to have any physical significance at the moment; their mathematical relevance to the original circuit will be clarified shortly. It will, however, become apparent in Section D that $t_1, \ldots, t_m$ may be thought of as independent "time" variables corresponding to the m tones, and that their utility lies in that they decouple the m time-scales of variation of the multitone signals of the circuit. Similarly, $\hat{x}$ and $\hat{b}$ will be seen to be efficient ways of representing the m-tone waveforms x(t) and b(t).

First, the following basic theorem is stated:

Theorem 1: If $\hat{x}(t_1, \ldots, t_m)$ and $\hat{b}(t_1, \ldots, t_m)$ satisfy the MCPDE (Equation 6), then $x(t) = \hat{x}(t, \ldots, t)$ and $b(t) = \hat{b}(t, \ldots, t)$ satisfy the circuit's DAE (Equation 5).

This theorem shows that if a solution $\hat{x}$ of the MCPDE is known, a solution of the circuit equations is immediately available by evaluating $\hat{x}$ on the "diagonal line" given by $t_1 = \ldots = t_n = t$. When the circuit waveforms are quasiperiodic multi-tone, further simple conditions are induced on the MCPDE, as shown next. First, the concept of quasi-periodicity of a signal is defined precisely.

Definition 1: A function of a single argument y(t) is called m-tone quasi-periodic if it can be expressed in the form $$y(t) = \sum_{i_1, \cdots, i_m} Y(i_1, \cdots, i_m) e^{j2\pi \left(\frac{i_1}{T_1} + \cdots + \frac{i_m}{T_m}\right)t}$$

$Y(i_1, \ldots, i_n)$ are real- or complex-valued constants.

Next, a concept of periodicity for multivariate signals (such as $\hat{x}$ and $\hat{b}$ in the MCPDE) is defined.

Definition 2: A multivariate function $\hat{y}(t_1, \ldots, t_m)$ is said to be independently m-periodic (or simply m-periodic) in each argument if $\hat{y}(t_1+k_1T_1, \ldots, t_m+k_mT_m) = \hat{y}(t_1, \ldots, t_m)$ for all real $t_1, \ldots, t_m$ and all integers $k_1, \ldots, k_m$. $T_1, \ldots, T_m$ are constant real numbers; $T_i$ is referred to as the period of the $i^{th}$ tone of $\hat{y}$ or simply the $i^{th}$ period of $\hat{y}$.

The following two lemmas establish that quasi-periodic signals and periodic multivariate signals are closely related. Lemma 1 shows that given any periodic multivariate signal $\hat{y}$, a quasi-periodic signal y is immediately obtained by evaluating $\hat{y}$ on the diagonal line. Lemma 2 shows that given any quasi-periodic signal y, a periodic multivariate signal y can be found that satisfies Lemma 1.

Lemma 1: If $\hat{y}(t_1, \ldots, t_m)$ is independently m-periodic in each of its arguments, then $y(t) = \hat{y}(t, \ldots, t)$ is m-tone quasi-periodic.

Lemma 2: Given any m-tone quasi-periodic function y(t), an independently m-periodic $\hat{y}(t_1, \ldots, t_m)$ can be found that satisfies $y(t) = \hat{y}(t, \ldots, t)$.

Applying the above lemmas to Theorem 1 results in the following theorem and corollary:

Theorem 2: If $\hat{b}$ is an m-periodic excitation to Equation 6 and $\hat{x}$ an m-periodic solution, then $x(t) = \hat{x}(t, \ldots, t)$ is an m-tone quasi-periodic solution of Equation 5 under the m-tone quasi-periodic excitation $b(t) = \hat{b}(t, \ldots, t)$.

Corollary 1: Given an m-periodic $\hat{b}$ such that $b(t) = \hat{b}(t, \ldots, t)$ it is sufficient to find a solution $\hat{x}$ of the MCPDE with m-periodic boundary conditions in order to obtain an m-tone quasi-periodic solution $x(t) = \hat{x}(t, \ldots, t)$ of the circuit DAE.

Theorem 2 and Corollary 1 establish that in order to find an m-tone quasi-periodic solution of the circuit equations, it is sufficient to (1) find an m-periodic $\hat{b}$ satisfying $\hat{b}(t, \ldots, t) = b(t)$, and (2) solve the MCPDE with m-periodic boundary conditions. That a well-defined solution of the MCPDE exists under such boundary conditions is indicated by the following theorem:

Theorem 3: The test MCPDE $$\frac{\partial \hat{x}}{\partial t_1} + \cdots + \frac{\partial \hat{x}}{\partial t_m} = \lambda \hat{x} + \hat{b}(t_1, \cdots, t_m)$$

(corresponding to the circuit equation $\dot{x} = \lambda x + b(t)$) with boundary conditions $$\hat{x}(t_1 + k_1 T_1, \cdots, t_m + k_m T_m) = \hat{x}(t_1, \cdots, t_m)$$

$$\forall t_1 \in R, k_1 \in N, i \in \{1, \cdots, m\}$$

has a unique solution $\hat{x}$ for any given m-periodic $\hat{b}$ if $Re(\lambda) \neq 0$.

Nonlinear MCPDEs corresponding to practical circuits usually have either unique solutions or a few different solutions (analogous to circuits having one or more DC operating points). The necessity of the real part of $\lambda$ not being zero is not surprising, considering that even simply periodic solutions of $\dot{x} = +\lambda x$ are not unique if $\lambda = 0$ (any constant x(t) suffices).

C. Efficient Numerical Methods for the MCPDE

Figure 21:
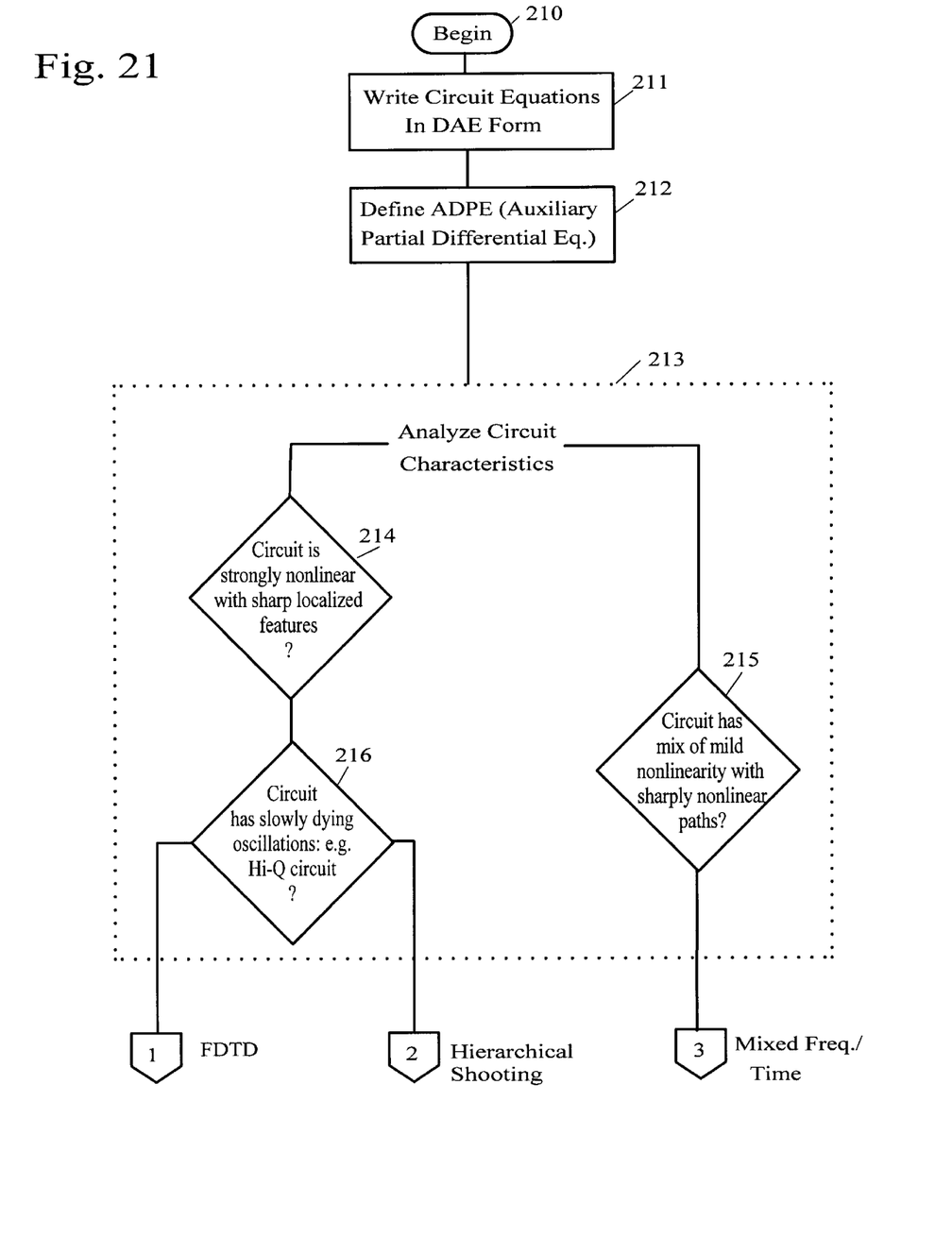
FIG. 21 shows a flowchart of the invention.

In this section, the three novel numerical methods of the invention are presented. FIG. 21 shows the beginning of the invention. The circuit equations in each case are written in DAE (Differential Algebraic Equation) form (211). Then, the MCPDE (Multi-rate Circuit Partial Differential Equations) of the circuit are defined (212). One of the methods of solving the MCPDE is then chosen (213) based on the circuit characteristics.

Two of the methods (multivariate FDTD and hierarchical shooting) solve the MCPDE purely in the time domain. The mixed frequency-time method solves for some of the dimensions of the MCPDE in the frequency domain.

The time-domain methods use adaptively generated non-uniform grids to sample the circuit's waveforms efficiently. This is especially useful for strongly nonlinear circuits, which generate sharp localized features. For such circuits, the matrices that arise in time-domain methods are also better suited for iterative linear methods than matrices from frequency-domain methods. This translates to an additional advantage for the simulation of large circuits.

An advantage of hierarchical shooting over multivariate FDID is that the size of the linear systems that need to be solved is smaller. This leads to a large saving in memory. Also, the grid in hierarchical shooting is induced naturally by the time-step control of the transient analysis algorithm—special grid refinement algorithms are not needed.

However, multivariate FDID can be more efficient than hierarchical shooting for circuits with slowly dying oscillations (e.g., high-Q circuits).

It is often the case in communication circuitry that some paths carry sinusoidal signals through only mild nonlinearities. Frequency domain methods are better for these circuits than time-domain ones. If the circuit also contains paths that are strongly nonlinear (e.g., as in switching mixers), then purely frequency- or time-domain techniques are both weak for part of the problem. It is in such situations that mixed frequency-time methods are preferred.

C.1 The Multivariate Finite Difference Time Domain (FDTD) method

Figure 22:
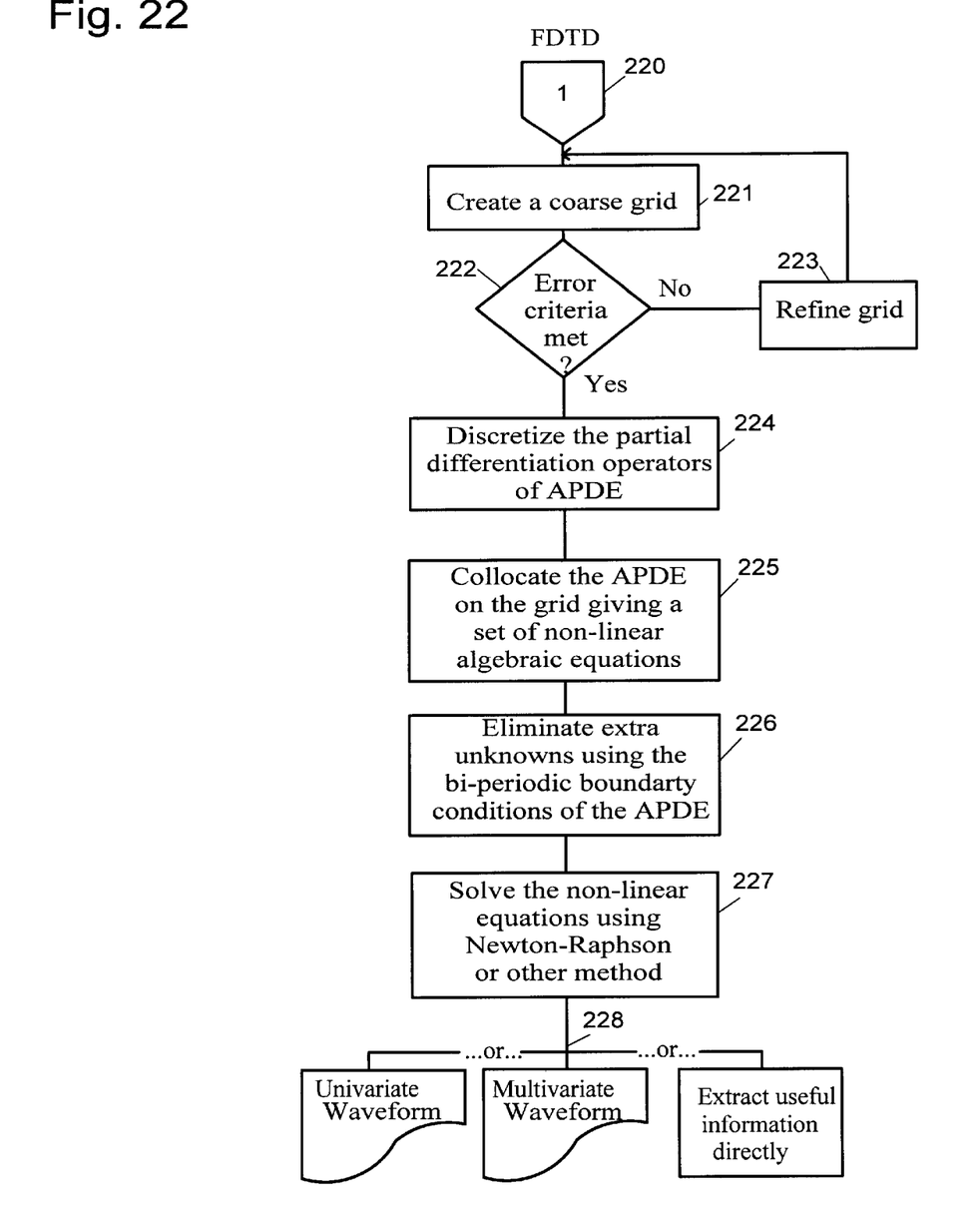
FIG. 22 shows a flowchart of the first multivariate FDTD method of the invention.

In this method (see FIG. 22), the MCPDE of Equation 6 is solved on a grid in the $t_1, \ldots, t_m$ space. Let the grid be the set of points $\{\bar{t}_1, \ldots, \bar{t}_n\}$ where each $\bar{t}_1 = (t_{1_1}, \ldots, t_{m_1})$. The partial differentiation operators of the MCPDE are discretized and the MCPDE collocated on this grid. This leads to a set of non-linear algebraic equations in the unknowns $\{\hat{x}(\bar{t}_1), ., \hat{x}(\bar{t}_n)\}$. The nonlinear equations are solved by a Newton-Raphson method.

For concreteness, consider the 2-tone case. The MCPDE simplifies to:

$$\frac{\partial q(\hat{x})}{\partial t_1} + \frac{\partial q(\hat{x})}{\partial t_2} = f(\hat{x}) + \hat{b}(t_1, t_2) \tag{7}$$

with boundary conditions $\hat{x}(t_1+T_1, t_2+T_2) = \hat{x}(t_1, t_2)$. Consider a uniform grid $\{\bar{t}_{i,j}\}$ of size $_{n1 \times n2}$ on the rectangle $[0, T_1] \times [0, T_2]$. Here $$t_{i,j} = (t_{1_i}, t_{2_j}), t_{1_i} = (i-1)h_1 \text{ and } t_{2_j} = (j-1)h_2,$$

$$1 \leq i \leq n_1, 1 \leq j \leq n_2.$$

$$h^1 = \frac{T_1}{n_1} \text{ and } h_2 = \frac{T_2}{n_2}$$

are the grid spacings in the $t_1$ and $t_2$ directions respectively.

Discretizing the differentiation operators using (say) the Backward Euler rule leads to:

$$\frac{\partial q(\hat{x})}{\partial t_1}(\bar{t}_{i,j}) = \frac{q(\hat{x}(\bar{t}_{i,j})) - q(\hat{x}(\bar{t}_{i-1,j}))}{h_1}, \tag{8}$$

$$\frac{\partial q(\hat{x})}{\partial t_2}(\bar{t}_{1,j}) = \frac{q(\bar{x}(\bar{t}_{i,j})) - q(\hat{x}(\bar{t}_{i,j-1}))}{h_2},$$

Collocating the MCPDE at the grid points $\{\bar{t}_{i,j}\}$, leads to $n = n_1 \times n_2$ equations:

$$F_{i,j} \equiv \frac{\hat{q}_{i,j} - \hat{q}_{i-1,j}}{h_1} + \frac{\hat{q}_{i,j} - \hat{q}_{i,j-1}}{h_2} - \hat{f}_{i,j} - \hat{b}_{i,j} = 0, \tag{9}$$

$$\forall i \in \{1, \cdots, n_1\}, \forall j \in \{1, \cdots, n_2\}, \hat{q}_{i,j} = q(\hat{x}(\bar{t}_{i,j})),$$

$$\hat{f}_{i,j} = f(\hat{x}(\bar{t}_{i,j})), \hat{b}_{i,j} = \hat{b}_{i,j}(\bar{t}_{i,j})$$

The n equations are, however, in a greater number of unknowns: $n_1 + n_2$ extra unknowns $\{\hat{x}(\bar{t}_{-1,j})\}$ and $\{\hat{x}(\bar{t}_{i,-1})\}$ result from discretizing the differentiation operators on the $t_1 = 0$ and $t_2 = 0$ lines respectively. These unknowns are eliminated using the bi-periodic boundary conditions of the MCPDE:

$$\hat{x}(\bar{t}_{1,-1}) = \hat{x}(\bar{t}_{i,n_2}-1), \hat{x}(\bar{t}_{-1,j}) = \hat{x}(\bar{t}_{n_1}-1,j) \tag{10}$$

On applying the boundary conditions, $n_1 + n_2$ unknowns are eliminated from Equation 11 and a system of n equations in n unknowns is obtained. Denote this system by:

$$F(X)=0, F=[F_{1,1}, \ldots, F_{1,n_2}, \ldots, \ldots, F_{n_1,1}, \ldots, F_{n_1,n_2}]^T \tag{11}$$

$$X=[\hat{x}(\bar{t}_{1,1}), \ldots, \hat{x}(\bar{t}_{1,n_2}), \hat{x}(\bar{t}_{2,1}), \ldots, \ldots, \hat{x}(\bar{t}_{n_1,1}), \ldots, \hat{x}(\bar{t}_{n_1,n_2})]^T$$

$F(x)=0$ is solved numerically by the Newton-Raphson method. For this, the Jacobian matrix of $F(.)$ is required. The Jacobian has the block structure:

$$\frac{\partial F}{\partial X} = \begin{bmatrix} D_1 & & & & -L_{n_1} \\ -L_1 & D_2 & & & \\ & -L_2 & D_3 & & \\ & & \ddots & \ddots & \\ & & & -L_{n_1-1} & D_{n_1} \end{bmatrix} \tag{12}$$

Each block is itself a $n_2 \times n_2$ block-matrix, given by:

$$D_i = \begin{bmatrix} \left(\frac{q'_{i,1}}{h_2} + f'_{i,1}\right) & & & & -\frac{q''_{i,n_2}}{h_2} \\ -\frac{q'_{i,1}}{h_2} & \left(\frac{q'_{i,2}}{h_2} + f'_{i,2}\right) & & & \\ & -\frac{q'_{i,2}}{h_2} & \left(\frac{q'_{i,3}}{h_2} + f'_{i,3}\right) & & \\ & & & \ddots & \\ & & & -\frac{q'_{i,n_2-1}}{h_2} & \left(\frac{q'_{i,n_2}}{h_2} + f'_{i,n_2}\right) \end{bmatrix} \tag{13}$$

$$L_i = \frac{1}{h_1} \begin{bmatrix} q'_{i,1} & & & & \\ & q'_{i,2} & & & \\ & & q'_{i,3} & & \\ & & & \ddots & \\ & & & & q'_{i,n_2} \end{bmatrix} \tag{14}$$

In the above, $q'_{i,j} = q'(\hat{x}(\bar{t}_{i,j}))$ and $f'_{i,j} = f'(\hat{x}(\bar{t}_{i,j}))$.

It is evident that $$\frac{\partial F}{\partial X}$$

is a sparse matrix, hence matrix-vector products with it can be performed cheaply. This makes iterative linear techniques attractive for solving the linear equations that arise at each NewtonRaphson step. Further, for the case where f and q are scalar, the matrix is diagonally dominant if (1) q(.) is linear and (2) f' has the same sign as q', as is the case for stable circuits. Diagonal dominance is a desirable property for iterative linear solvers because it ensures fast convergence. For the case where f and q are vector functions, block-diagonal dominance holds for most practical circuits.

In the above, a uniform grid was assumed for simplicity. In practice, the grid is non-uniform, built up adaptively by starting from a coarse grid and refining until an error criterion is met.

C.2 Hierarchical Shooting

Figure 23:
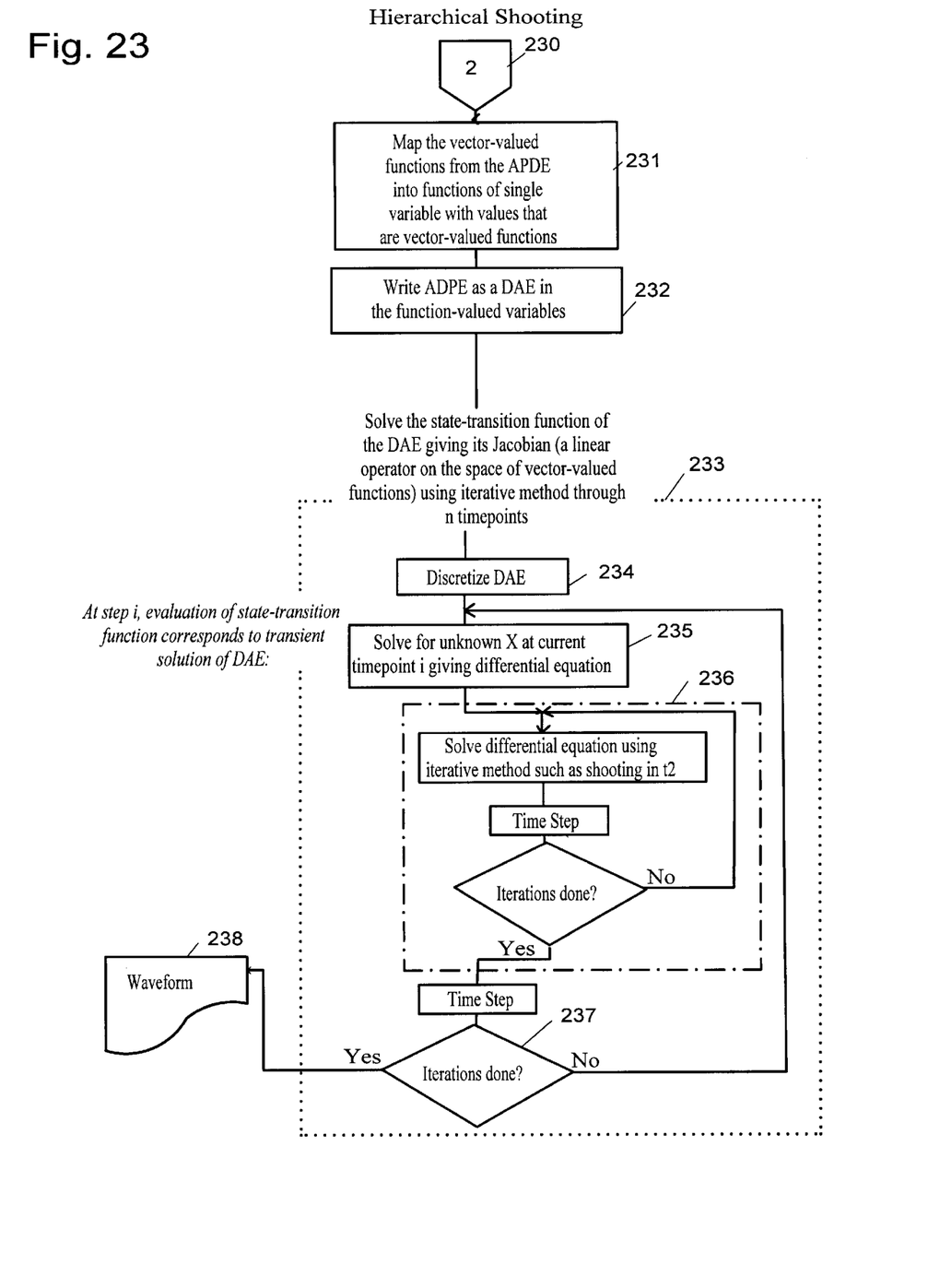
FIG. 23 shows a flowchart of the second hierarchical shooting method of the invention.

A hierarchical extension of the classical shooting algorithm is presented in this section for solving the MCPDE (see FIG. 23). The key to this method is to view the MCPDE as an ordinary differential equation in function space variables. For concreteness, consider again the 2-tone MCPDE of Equation 7:

$$\frac{\partial q(\hat{x})}{\partial t_1} = \frac{\partial q(\hat{x})}{\partial t_2} = f(\hat{x}) + \hat{b}(t_1, t_2) \quad (15)$$

In this equation, the variables $\hat{x}$, q, f and $\hat{b}$ are all vector-valued functions of two variables $t_1$ and $t_2$, i.e., they are maps from $R^2 \to R^k$, where k is the size of the circuit. However, they can each be also regarded as functions of a single variable with values that are vector-valued functions, i.e., they are maps from $R \to \{h(.): R \to R^k\}$. Let these maps be $Q(t_1)$, $X(t_1)$, $F(t_1)$ and $B(t_1)$, corresponding to $q(t_1, t_2)$, $\hat{x}(t_1, t_2)$, $f(t_1, t_2)$ and $\hat{b}(t_1, t_2)$ respectively (the function-valued variables F and X should not be confused with the vector-valued ones of the previous section). In other words, $Q(t_1)$ equals the entire function $q(t_1,.)$ for fixed $t_1$; similarly for the other variables.

The MCPDE can then be written formally as a DAE in the function-valued variables:

$$\frac{dQ(X)}{dt_1} = F(X) + B(t_1) - D_{t_2}[Q(X)] \quad (16)$$

$D_{t_2}$ is an operator that differentiates the function (of $t_2$) that it operates on.

Equation 16, a DAE, is solved by "Meta-Shooting" using the shooting methodology (a certain version of which is prior art). Let $\Phi(X_0, t_1)$ be the state-transition function of the DAE. Shooting solves the equation:

$$\Phi(X, T_1) - X = 0 \quad (17)$$

using (for example) the Newton-Raphson method.

The Jacobian of this equation is not a simple matrix; rather, it is a linear operator on the space of vector-valued functions of $t_2$. This is novel—the prior art uses shooting where the Jacobian is a matrix. Further, each evaluation of the left-hand side of Equation 17 corresponds to a transient solution of the DAE in Equation 16. This transient solution is achieved by discretizing Equation 16 using (say) Backward Euler:

$$\frac{Q(X(t_{1_i})) - Q(X(t_{1_{i-1}}))}{t_{1_i} - t_{1_{i-1}}} = F(X(t_{1_i})) + B(t_{1_i}) - D_{t_2}[Q(X(t_{1_i}))] \quad (18)$$

and solving for the unknown $X(t_{1_i})$ (i.e., X at the current timepoint i). Note that Equation 18 is itself a differential equation in $t_2$, since it can be rewritten as:

$$\frac{dQ(X(t_{1_i}))}{dt_2} = -\frac{Q(X(t_{1_i})) - Q(X(t_{1_{i-1}}))}{t_{1_i} - t_{1_{i-1}}} + F(X(t_{1_i})) + B(t_{1_i}) \quad (19)$$

This DAE can now be solved using shooting (or another method, e.g., uni-variate FDTD or harmonic balance) in $t_2$. This "inner loop" solution is performed for each time-step of the "outer loop" of Equation 16.

The outer loop DAE (Equation 16) can also be solved forward in $t_1$ without searching for a periodic solution, i.e., Equation 17 need not be enforced. The inner loop is still solved for a periodic solution in $t_2$. This results in a purely time-domain algorithm for multi-tone envelope following.

C.3 The mixed frequency-time method

Figure 24:
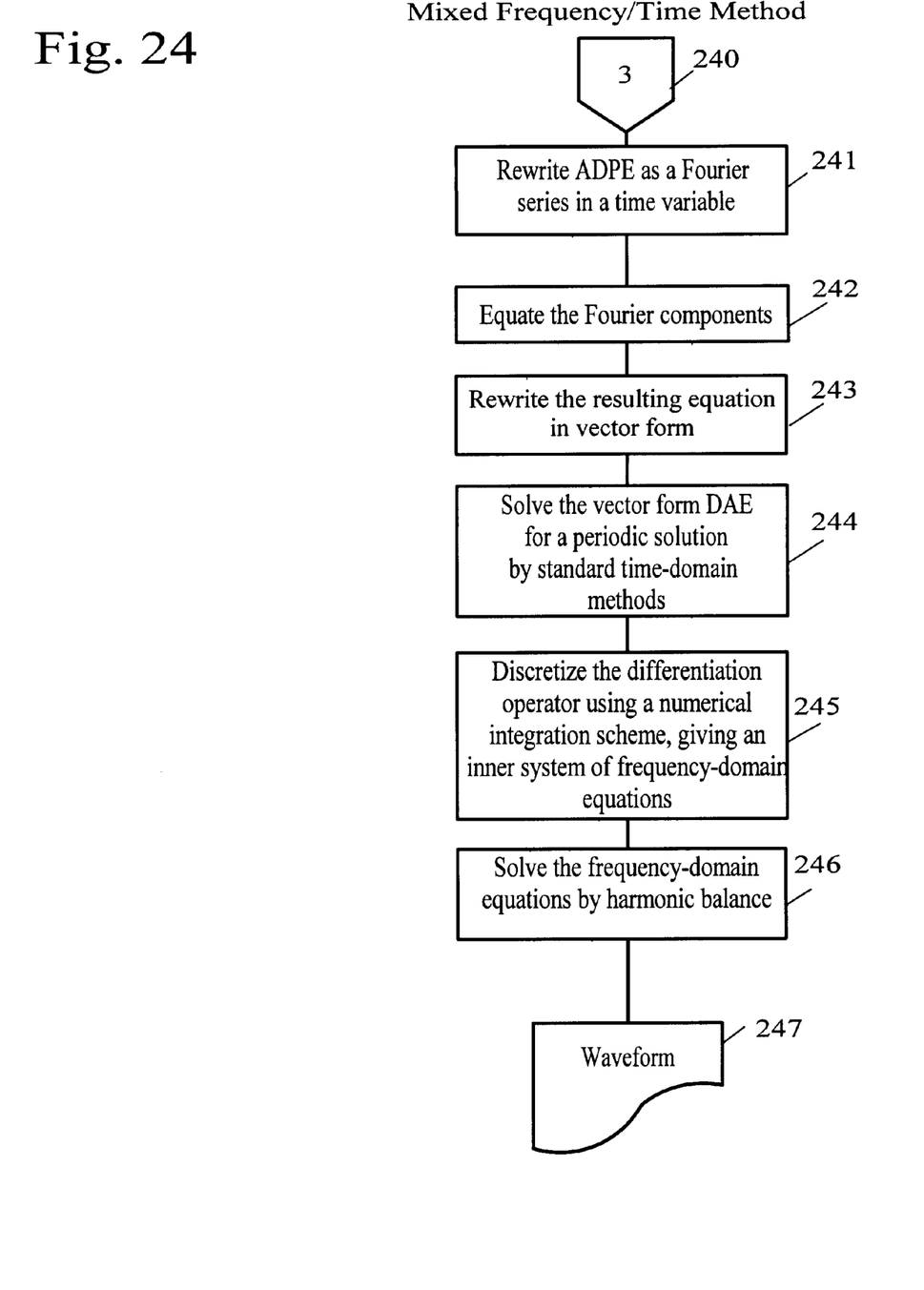
FIG. 24 shows a flowchart of the third mixed frequency-time method of the invention.

FIG. 24 shows a flowchart for this third method.

Since $\hat{x}(t_1, \ldots, t_m)$ and $\hat{b}(t_1, \ldots, t_m)$ are m-periodic, they can be expressed as Fourier series in each variable $t_i$. If the circuit is such that the Fourier series in some of the variables have relatively few significant components, then it is advantageous to solve the mixed frequency-time system obtained by taking a Fourier series expansion of the MCPDE in those variables. The 2-tone case will again be used for the purpose of exposition.

Equation 7 is rewritten as a Fourier series in $t_1$:

$$\sum_{i=-M}^{M} ijw_1 Q_i(t_2) e^{ijw_1 t_1} + \sum_{i=-M}^{M} \frac{\partial Q_i(t_2)}{\partial t_2} e^{ijw_1 t_1} = \quad (20)$$

$$\sum_{i=-M}^{M} F_i(t_2) e^{ijw_1 t_1} + \sum_{i=-M}^{M} B_i(t_2) e^{ijw_1 t_1}$$

where $$j = \sqrt{-1}, \; w_1 = \frac{2\pi}{T_1},$$

and $Q_1$, $F_1$, $B_1$ are the Fourier components in $t_1$ of $q(\hat{x}(t_1, t_2))$, $f(\hat{x}(t_1, t_2))$ and $\hat{b}(t_1, t_2)$ respectively. M is the (small) number of significant harmonics. The Fourier components in Equation 20 can then be equated:

$$ijw_1 Q_i(t_2) + \frac{\partial Q_i(t_2)}{\partial t_2} = F_i(t_2) + B_i(t_2), \; i \in \{-M, \cdots, M\} \quad (21)$$

Equation 21 can be rewritten in vector form:

$$\frac{d\overline{Q}(t_2)}{dt_2} = -j\Omega_1(t_2) + \overline{F}(t_2) + \overline{B}(t_2) \quad (22)$$

where

-continued $$\Omega_1 = w_1 \begin{bmatrix} M & & & \\ & \ddots & & 0 \\ & & \ddots & \\ & & & M \end{bmatrix}, \overline{Q} = \begin{bmatrix} Q_M \\ \vdots \\ Q_O \\ \vdots \\ Q_{-M} \end{bmatrix},$$

$$\overline{F} = \begin{bmatrix} F_M \\ \vdots \\ F_O \\ \vdots \\ F_{-M} \end{bmatrix}, \overline{B} = \begin{bmatrix} B_M \\ \vdots \\ B_O \\ \vdots \\ B_{-M} \end{bmatrix}.$$

Equation 22, being a vector DAE, is solved for a periodic solution by standard time domain methods such as standard shooting or uni-variate FDTD. Solving in the time domain makes it possible to use non-uniform time-steps and hence to capture the effects of strong nonlinearities efficiently.

In order to solve equation 22 in the time domain, the differentiation operator $$\frac{d\overline{Q}(t_2)}{dt_2}$$

in equation 22 is discretized using a numerical integration scheme. This results in an inner system of frequency-domain equations that are solved by harmonic balance.

An alternative method using shooting/FDTD in the inner loop and harmonic balance in the outer can also be derived, using the function-space variable concept (as in Section C.2).

As with hierarchical shooting, Equation 22 can be solved as an initial value problem rather than with periodic boundary conditions. This leads a generalization of the envelope-following method of Feldmann et al (P. Feldmann and J. Roychowdhury. "Computation of circuit waveform envelopes using an efficient, matrix-decomposed harmonic balance algorithm" *Proc. ICCAD*, November 1996) without restrictions on the time-scales of the tones.

D. Experimental Results

In this section, the methods of the invention are applied to practical circuits operating in strongly nonlinear regimes. CPU times from the new methods, as well as from traditional methods, are summarized in Table 1. The circuits and waveforms are described in the following sections.

TABLE 1

CPU times (SPARC 20, 96MB, SunOS4.1.3)

| Circuit | New Method | Traditional Shooting | Speedup |
|---------|------------|---------------------|---------|
| Ckt1    | 40 sec     | 1 hour 21 min       | 121.5 times |
| Ckt2    | 1 min 9 sec | 1 hour 36 min      | 83.47 times |
| Ckt3    | 25 sec     | 1 hour 52 min       | 250.8 times |

As can be seen from Table 1, speedups of two orders of magnitude are obtained using the new methods. Also, it is shown in the following sections that traditional shooting tends to accumulate errors during long simulations, which can lead to grossly inaccurate results. The new methods do not suffer from this disadvantage.

Figure 8:
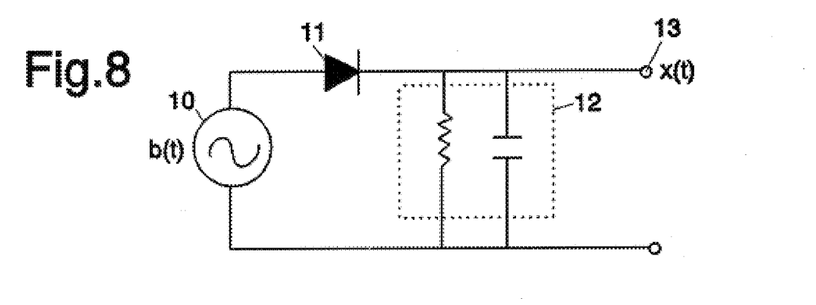
FIG. 8 shows a schematic of a nonlinear circuit, analyzed as ckt1 and ckt2 in sections D.1 and D.2, below.

D.1 Example 1: ckt1 ckt1 (see FIG. 8) is a strongly nonlinear diode rectifier (11) circuit powered by a two-tone power source (10) whose waveform is b(t). The output of the rectifier (11) is low-pass filtered (12), giving a filter output (13) of x(t). The power source (10) consists of a train of fast pulses whose duty cycle is modulated at a much slower rate. More precisely, each fast pulse in the train is given by the function pulse $$\left(\frac{t}{0.1\mu}, duty\right),$$

where duty indicates the duty cycle (the fraction of the cycle spent at 1). The overall excitation b(t) is given by:

$$b(t) = \text{pulse}\left(\frac{t}{T_2}, 0.2 + 0.3\sin\left(\frac{2\pi}{T_1}\right)\right), T_1 = 1 \text{ ms}, T_2 = 0.1 \text{ }\mu\text{s}$$

Figure 9A:
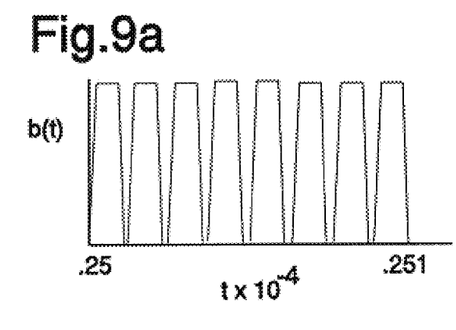
FIGS. 9a and 9b show a train of fast pulses whose duty cycle is modulated at a much slower rate, graphed at widely separated times, representing the waveform b(t) input to the circuit of FIG. 8.
Figure 9B:
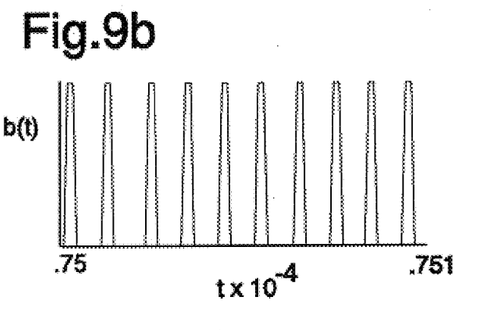

Two segments of b(t), at widely separated times, are plotted in FIGS. 9a and 9b—the variation in duty cycle can be seen. The duty-cycle variation of b(t) is more apparent in its bi-variate form $\hat{b}(t_1, t_2)$:

$$\hat{b}(t_1, t_2) = \text{pulse}\left(\frac{t_2}{T_2}, 0.2 + 0.3\sin\left(\frac{2\pi t_1}{T_1}\right)\right), T_1 = 1 \text{ ms}, T_2 = 0.1 \text{ }\mu\text{s}$$

Figure 10:
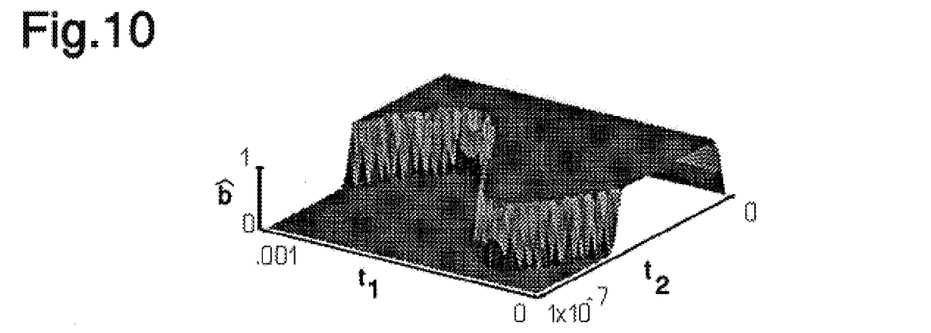
FIG. 10 shows a three-dimensional graph of the bi-variate form of the input waveform of FIGS. 9a and 9b.

$\hat{b}(t_1, t_2)$ form is plotted in FIG. 10. The duty cycle is the extent of the high region while moving along the $t_2$ direction. This varies sinusoidally with respect to the slow "time" variable $t_1$.

The circuit was simulated using the multivariate FDTD method of the invention and also by traditional univariate shooting for comparison. As shown in Table 1, the new method was faster by over two orders of magnitude.

Figure 11:
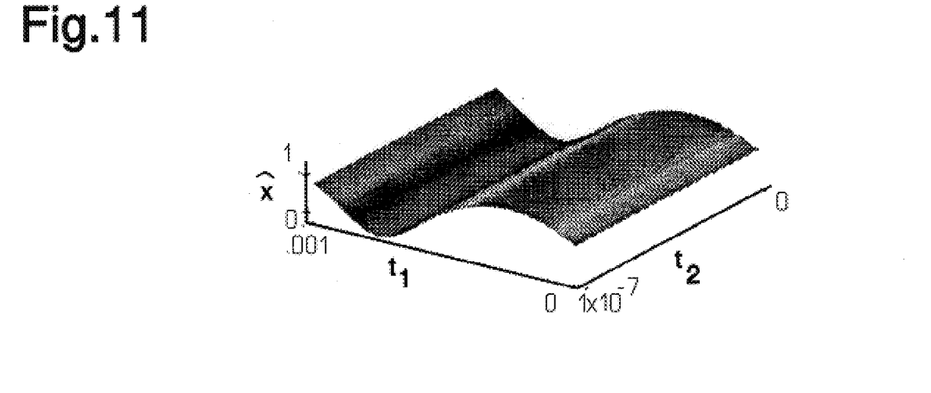
FIG. 11 shows a three-dimensional graph of the output of the circuit of FIG. 8, as analyzed by the method of the invention in section D.1, below.

The bi-variate form $\hat{x}$ of the output x(t) is shown in FIG. 11. The low-pass filter has smoothed out the fast variations in the $t_2$ direction. Since the rectified output depends on the duty cycle on the input, a slow-scale sinusoidal variation is observed as a function of $t_1$.

Figure 12:
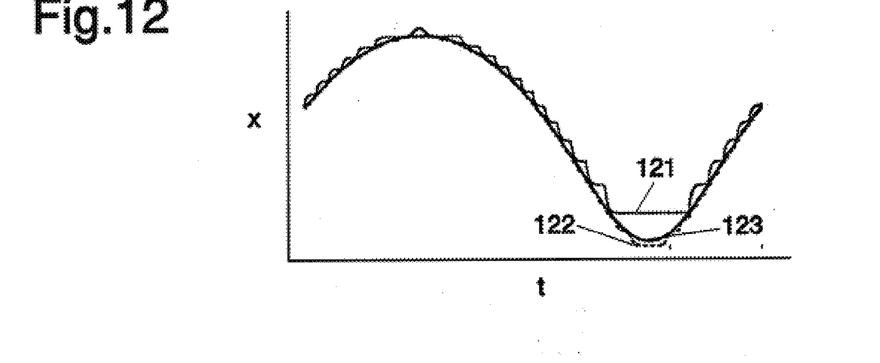
FIG. 12 shows a graph of a univariate solution to the rectifier output in the circuit of FIG. 8.

Plots of the uni-variate solution x(t) are shown in FIG. 12. The waveform obtained from the bi-variate solution is denoted by the solid line (123), and those from traditional shooting using 20 and 50 time-steps per fast pulse by dotted lines 121 and 122, respectively. Traditional shooting using 20 time-steps per pulse accumulates errors that grow to 15% near t=0.8 ms, despite tight local error control. Increasing the number of time-steps to 50 per pulse reduces the error significantly, but it is still visible at about 3% (the CPU time in Table 1 is for this simulation). The new method produces an accurate waveform.

Figure 13:
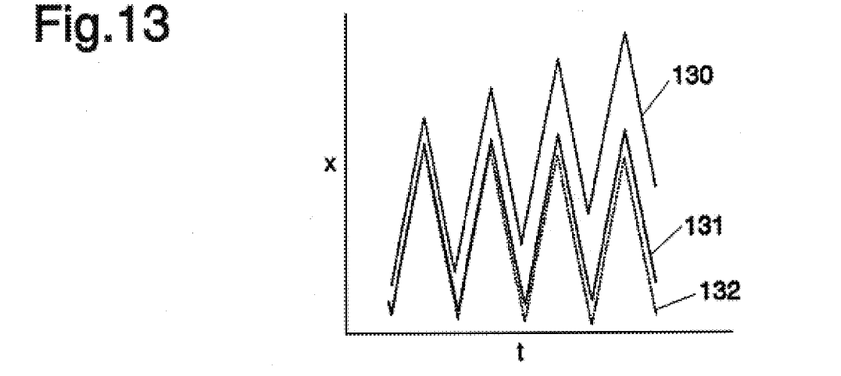
FIG. 13 shows a graph of the fast scale detail of the graph of FIG. 12, near t=0.

The fast-scale detail of x(t) near t=0 is shown in FIG. 13 for the new method (131) and 20 (130) and 50 (132) time steps. Because of the relatively long time-constant of the smoothing filter, the shape of the ripple is nearly triangular.

D.2 Example 2: ckt2 ckt2 is the same circuit as ckt1 but with a more abrupt excitation. The duty cycle, instead of varying slowly as a sinusoid, switches abruptly between 0.2 and 0.8. The power source b(t) in this circuit is:

$$b(t) = \text{pulse}\left(\frac{t}{T_2}, 0.2 + 0.6\text{pulse}\left(\frac{t}{T^1}\right)\right), T_1 = 1 \text{ ms}, T_2 = 0.1 \text{ }\mu\text{s}$$

Figure 14:
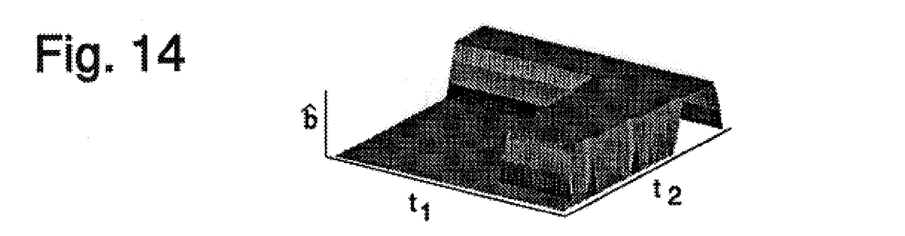
FIG. 14 shows a three-dimensional graph for an alternate excitation (input waveform) of the circuit analyzed by the method of the invention in section D.2, below.

The bi-variate form $\hat{b}(t_1, t_2)$ is shown in FIG. 14.

Figure 15:
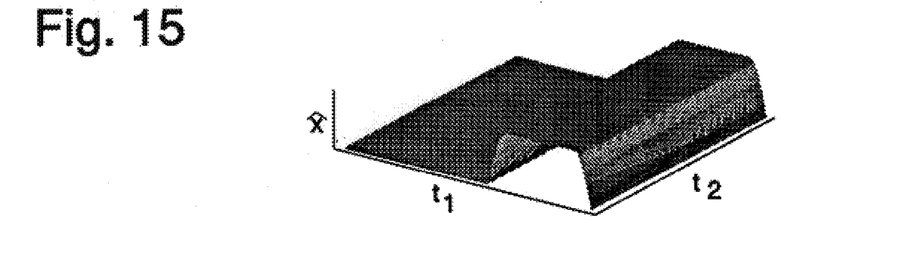
FIG. 15 shows a three-dimensional graph of the output of the circuit of FIG. 8 with the excitation of FIG. 14, as analyzed by the method of the invention in section D.2, below.

This circuit was simulated using hierarchical shooting. The bi-variate form $\hat{x}$ of the output is shown in FIG. 15. The variation in $t_2$ has been smoothed out as before, but the variation in $t_2$ now resembles a pulse, as expected.

Figure 16:
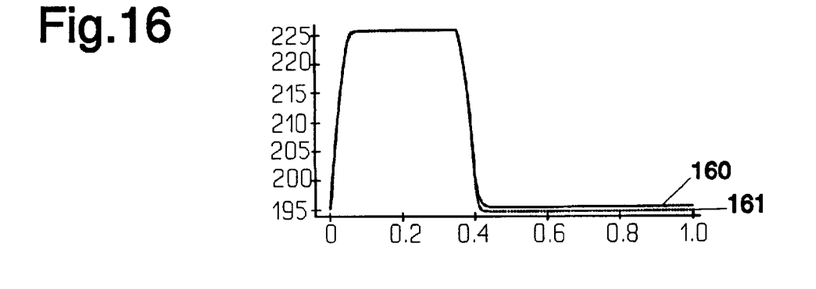
FIG. 16 shows the univariate solution corresponding to FIG. 15.

The univariate solution is plotted in FIG. 16, for the new method (160) and traditional shooting at 50 steps per fast pulse (161). The 3% inaccuracy from traditional shooting with 50 steps per fast pulse (161) is again evident.

Figure 17:
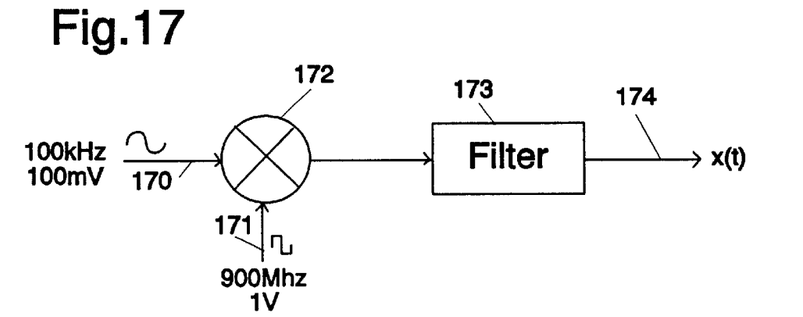
FIG. 17 shows a schematic of a mixer/filter circuit analyzed according to the method of the invention as ckt3, in section D.3, below.

D.3 Example 3: ckt3 ckt3 (FIG. 17) consists of a switching mixer (172) and filter (173). The RF input (170) to the mixer (172) is a 100 kHz sinusoid with amplitude 100 mV; this drives it into a mildly nonlinear regime. The LO input (171) is a square wave of large amplitude (1V) at 900 Mhz; this switches the mixer (172) on and off at a fast rate.

The circuit was simulated using the new mixed-frequency time method, as well as by traditional shooting. For the new method, 3 harmonics were taken in the RF tone $f_1=100$ kHz (corresponding to the $t_1$ variable of Section C.3). The LO tone at $f_2=900$ MHz was handled by shooting in the $t_1$ variable. The output of the method is a set of time-varying harmonics that are periodic with period $$T_2 = \frac{1}{f_2}.$$

Figures 18, 19, 20:
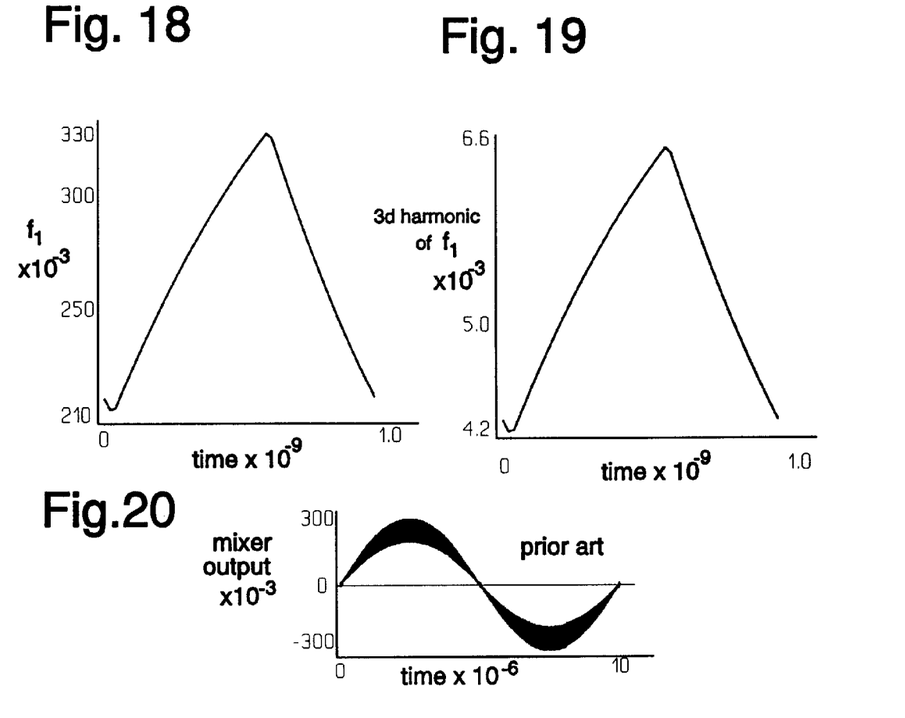
FIG. 18 shows a graph of the first harmonic component of the mixed frequency-time output of the circuit of FIG. 17.
FIG. 19 shows a graph of the third harmonic component of the mixed frequency-time output of the circuit of FIG. 17.
FIG. 20 shows a graph of the output of the circuit of FIG. 18, as produced by traditional shooting methods.

The first harmonic is shown in FIG. 18. This plot contains information about all mix components of the form $f_1+if_2$, i.e., the frequencies 900.1 MHz, 1800.1 MHz, etc.. The main mix component of interest, 900.1 Mhz, is found by taking the first Fourier component of the waveform in FIG. 18. This has an amplitude of 60 mV.

The third harmonic is shown in FIG. 19. It contains information about the mixes $3f_1+if_2$, i.e., the frequencies 900.3 Mhz, 1800.3 Mhz, etc.. The amplitude of the 900.3 Mhz component can be seen to be about 1.1 mV; hence the distortion introduced by the mixer is 35 dB below the desired signal.

The output produced by traditional shooting is shown in FIG. 20. This run, using 50 steps per fast period, took almost 300 times as long as the new method.

F. Conclusion

Three new methods have been presented for simulating circuits that have a combination of multi-tone excitations and strongly nonlinear behaviour. Such circuits are difficult or impossible to analyze using existing methods, yet they are important in new designs for integrating RF circuitry on-chip.

The new techniques are much faster and more accurate than existing ones.

The algorithms use multi-variate forms of circuit variables to represent multi-tone signals efficiently. An Multi-rate Circuit Partial differential equation (MCPDE) is solved to obtain the circuit solution. The three methods solve the MCPDE in different ways. Multivariate FDTD collocates the MCPDE on a grid; hierarchical shooting performs a nested sequence of one-dimensional shooting steps in function-space variables; the mixed frequency-time algorithm uses harmonic balance in some dimensions and shooting/FDTD in the others. Adaptive non-uniform gridding is used to ensure efficiency and accuracy.

The choice of method is dictated by the nature of the circuit and the available computational resources. The mixed frequency-time method is best suited for circuits with signal paths that are weakly nonlinear in some tones. For circuits without weakly nonlinear paths, either multivariate FDTD or hierarchical shooting may be used. The latter method uses much less memory but can have slower convergence than the former. Small modifications to the three methods enable them to simulate waveform envelopes in strongly nonlinear circuits.

The new methods were used to simulate three strongly nonlinear circuits excited by widely separated tones. Multivariate FDTD and hierarchical shooting were applied to a rectifier with sharp transitions at both fast and slow time scales. The mixed frequency-time algorithm was used to analyze a switching mixer. Speedups of more than two orders of magnitude over traditional (one-dimensional) shooting, as well as improvements in accuracy, were demonstrated.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A method of analyzing a circuit having node voltages, branch currents and a characteristic waveform, comprising the steps of:
   a) characterizing the node voltages and branch currents of the circuit in the form of differential algebraic equations (DAEs);
   b) deriving from the DAEs a multivariate multi-rate circuit partial differential equation (MCPDE) having partial differentiation operators and boundary conditions and comprising vector-valued functions;
   c) solving the multivariate MCPDE using a numerical method, giving a solution representative of the waveform of the circuit, wherein the numerical method is hierarchical shooting, comprising the steps of:
      i) mapping the vector-valued functions of the MCPDE into functions of single variables with values that are vector-valued functions;
      ii) characterizing the MCPDE as a differential algebraic equation in terms of the single variables with values that are vector-valued functions, the differential algebraic equation having a state-transition function;
      iii) solving the state-transition function giving its Jacobian using an iterative method comprising the steps of:
         A) discretizing the differential algebraic equation;
         B) solving for unknown X at the current timepoint i giving a differential equation;
         C) solving the differential equation using an iterative method;
         D) incrementing the timepoint;
         E) repeating from step (c)(iii)(B) until all timepoints have been solved;
   d) displaying the characteristic waveform of the circuit by displaying the solution of the solved multivariate MCPDE in the form of a graph.

2. The method of claim 1, in which the iterative method of step (c)(iii)(C) is shooting.

3. The method of claim 1, in which the iterative method of step (c)(iii)(C) is harmonic balance.

4. The method of claim 1, in which the iterative method of step (c)(iii)(C) is univariate FDTD.

5. A method of making a circuit, comprising the steps of:
   a) providing a first circuit design;
   b) determining the performance of the first circuit design by mathematical analysis;
   c) comparing the performance of the first circuit design to a desired performance, with the performance of the first circuit design being within predetermined limits of the desired performance; and
   d) making the circuit in accordance with said first circuit design; wherein step b) comprises the steps of:

i) characterizing the node voltages and branch currents of the circuit in the form of differential algebraic equations (DAEs);

ii) deriving from the DAEs a multivariate multi-rate circuit partial differential equation (MCPDE) having partial differentiation operators and boundary conditions and comprising vector-valued functions;

iii) solving the multivariate MCPDE using a numerical method, wherein the numerical method is hierarchical shooting, comprising the steps of:

A) mapping the vector-valued functions of the MCPDE into functions of single variables with values that are vector-valued functions;

B) characterizing the MCPDE as a differential algebraic equation in terms of the single variables with values that are vector-valued functions, the differential algebraic equation having a state-transition function;

C) solving the state-transition function giving its Jacobian using an iterative method comprising the steps of:
  i) discretizing the differential algebraic equation;
  ii) solving for unknown X at the current timepoint i giving a differential equation;
  iii) solving the differential equation using an iterative method;
  iv) incrementing the timepoint;
  v) repeating from step (d)(iii)(C)(2) until all timepoints have been solved.

6. The method of claim 5, further comprising:

providing, prior to steps a)–c), a second circuit design that differs from said first circuit design, determining the performance of the second circuit design by said mathematical analysis, comparing the performance of the second circuit design to said desired performance, if the performance of the second circuit design is not within said predetermined limits of the desired performance, changing the second circuit design in response to the result of the comparing step, the changed second circuit design being said first circuit design.

7. The method of claim 5, in which the iterative method of step (d)(iii)(C)(iii) is shooting.

8. The method of claim 5, in which the iterative method of step (d)(iii)(C)(iii) is harmonic balance.

9. The method of claim 5, in which the iterative method of step (d)(iii)(C)(iii) is univariate FDTD.

10. A circuit analyzer for generating a graphic representation of a predicted performance of a circuit, the circuit analyzer comprising:

an input device for inputting a plurality of circuit parameters representing the circuit;

memory and stored programs for receiving and storing the circuit parameters;

a processor operating with the stored programs and having:

means for processing the circuit parameters;

means for characterizing the node voltages and branch currents of the circuit in the form of differential algebraic equations (DAEs);

means for deriving from the DAEs a multivariate multi-rate circuit partial differential equation (MCPDE) having partial differentiation operators and boundary conditions and comprising vector-valued functions;

means for solving the multivariate MCPDE using a numerical method, wherein the numerical method is hierarchical shooting, comprising the steps of:

a) mapping the vector-valued functions of the MCPDE into functions of single variables with values that are vector-valued functions;

b) characterizing the MCPDE as a differential algebraic equation in terms of the single variables with values that are vector-valued functions, the differential algebraic equation having a state-transition function;

c) solving the state-transition function giving its Jacobian using an iterative method comprising the steps of:
  i) discretizing the differential algebraic equation;
  ii) solving for unknown X at the current timepoint i giving a differential equation;
  iii) solving the differential equation using an iterative method;
  iv) incrementing the timepoint;

v) repeating from step (c)(ii) until all timepoints have been solved;

means for generating the graphic representation from the solved MCPDE to predict the performance of the circuit; and a display for displaying the graphic representation.

11. The method of claim 10, in which the iterative method of step (c)(iii) is shooting.

12. The method of claim 10, in which the iterative method of step (c)(iii) is harmonic balance.

13. The method of claim 10, in which the iterative method of step (c)(iii) is univariate FDTD.

* * * * *